United States Patent
Onishi

(10) Patent No.: US 8,374,363 B2
(45) Date of Patent: Feb. 12, 2013

(54) AMPLIFIER CIRCUIT OF CAPACITOR MICROPHONE

(75) Inventor: Akinobu Onishi, Ota (JP)

(73) Assignees: SANYO Semiconductor Co., Ltd., Gunma (JP); Semiconductor Components Industries, LLC, Phoenix, AZ (US)

(*) Notice: Subject to any disclaimer, the term of this patent is extended or adjusted under 35 U.S.C. 154(b) by 358 days.

(21) Appl. No.: 12/728,643

(22) Filed: Mar. 22, 2010

(65) Prior Publication Data

US 2010/0254549 A1 Oct. 7, 2010

(30) Foreign Application Priority Data

Apr. 3, 2009 (JP) ................................. 2009-090879

(51) Int. Cl.
*H04R 3/00* (2006.01)
(52) U.S. Cl. .......... 381/122; 381/91; 381/120; 381/111; 330/282
(58) Field of Classification Search .......... 381/91–92.12, 381/111–114, 122, 120; 330/282
See application file for complete search history.

(56) References Cited

U.S. PATENT DOCUMENTS

| 6,069,959 A | * | 5/2000 | Jones | 381/71.6 |
| 2009/0285412 A1 | * | 11/2009 | Wu | 381/98 |

FOREIGN PATENT DOCUMENTS

| EP | 1 096 831 | 5/2001 |
| JP | 2001-102875 | 4/2001 |
| JP | 2008-153981 | 7/2008 |

* cited by examiner

*Primary Examiner* — Disler Paul
(74) *Attorney, Agent, or Firm* — Morrison & Foerster LLP

(57) ABSTRACT

In an amplifier circuit of a capacitor microphone, when a too high input signal from the capacitor microphone is inputted, the levels of output signals of the amplifier circuit are limited. A first feedback capacitor of an operational amplifier is formed using a changeable capacitance type MOS capacitor element, and has a characteristic of increasing the capacitance value CAf1 according to the amplitude of an input signal generated by a capacitor increases. Therefore, CAf (=CAf1+CAF2) increases according to the amplitude of the input signal increases, and accordingly the gain of the operational amplifier decreases, thereby limiting the output signals of the operational amplifier. This realizes the appropriate limitation of the output signals of the operational amplifier, even when the amplitude of the input signal becomes too high.

6 Claims, 6 Drawing Sheets

US 8,374,363 B2

AMPLIFIER CIRCUIT OF CAPACITOR MICROPHONE

CROSS-REFERENCE OF THE INVENTION

This application claims priority from Japanese Patent Application No. JP 2009-090879, the content of which is incorporated herein by reference in its entirety.

BACKGROUND OF THE INVENTION

1. Field of the Invention

The invention relates to an amplifier circuit of a capacitor microphone generating an electric signal corresponding to sound.

2. Description of the Related Art

There are a MEMS microphone and an electret capacitor microphone (ECM) as a type of capacitor microphone. The fundamental structure of the MEMS microphone is a capacitor made of two electrode plates, i.e., a diaphragm and a back plate that are closely faced and disposed, and this structure is formed on a silicon substrate by a MEMS (Micro Electro Mechanical Systems) technique. This MEMS microphone is resistant to a temperature in a normal solder reflow process, and may be soldered on a printed board together with other components, for example. The MEMS microphone may be formed smaller than a general electret capacitor microphone (ECM). For this reason, a device with the MEMS microphone achieves high packaging density and miniaturization.

While the ECM uses an electret element that stores electric charge semipermanently and thus does not need a bias voltage, the MEMS microphone needs a relatively high direct current bias voltage for operation. By applying this bias voltage, a constant electric charge Q is charged in the capacitor forming the MEMS microphone. When the diaphragm vibrates by sound pressure in this state, the capacitance C of the capacitor changes to change a voltage V between terminals. This change of the voltage V is outputted as a sound signal.

An amplifier circuit of a MEMS microphone is described in Japanese Patent Application Publication No. 2008-153981, as formed using a charge pump circuit as a bias voltage generation source and an operational amplifier as a signal amplification portion. An amplifier circuit of an electret capacitor microphone (ECM) is described in Japanese Patent Application Publication No. 2001-102875.

In an amplifier circuit of a capacitor microphone, an inversion amplifier circuit is formed using an operational amplifier, a capacitor microphone Cm and a feedback capacitor Cf. An input signal from the capacitor microphone is amplified by a ratio of CAm/CAf and outputted, where CAm is the capacitance value of the capacitor microphone Cm, and CAf is the capacitance value of the feedback capacitor Cf. In this case, when the input signal inputted to the inversion amplifier circuit is too high, there occurs a problem such that an output signal of the inversion amplifier circuit has an amplitude at the full scale level of a circuit in a subsequent stage or more or becomes the supply voltage of the inversion amplifier or more, and is clipped at the supply voltage (i.e., waveform distortion occurs).

Particularly when the circuit in the subsequent stage that receives the output signal of the inversion amplifier circuit is an AD converter (an analog-digital converter), the level of the output signal of the inversion amplifier circuit has an amplitude at the full scale level of the AD converter or more (0 dBFS or more), or the waveform of the output signal becomes distorted. Then there occurs a problem such that the level of the output signal of the AD converter is saturated (clipped) and the total harmonic distortion characteristic (THD characteristic) is highly enhanced.

SUMMARY OF THE INVENTION

The invention provides an amplifier circuit of a capacitor microphone. The circuit includes a capacitor microphone generating an input signal corresponding to a sound received by the capacitor microphone, and an operational amplifier having an input terminal and an output terminal. The input signal from the capacitor microphone is applied to the input terminal. The circuit also includes a first feedback capacitor connected between the output terminal and the input terminal of the operational amplifier and configured to increase a capacitance in response to an increase in an amplitude of the input signal, and a feedback resistor connected between the output terminal and the input terminal of the operational amplifier.

DETAILED DESCRIPTION OF THE INVENTION

An amplifier circuit of a capacitor microphone of an embodiment of the invention will be described referring to FIGS. 1 to 6. In this embodiment, the amplitude of an output signal of an inversion amplifier circuit is limited according to the amplitude of an input signal by using a MOS capacitor element as a feedback capacitor of the inversion amplifier circuit. The MOS capacitor element has a characteristic of increasing its capacitance value according to the amplitude of the input signal increases.

Figure 1:
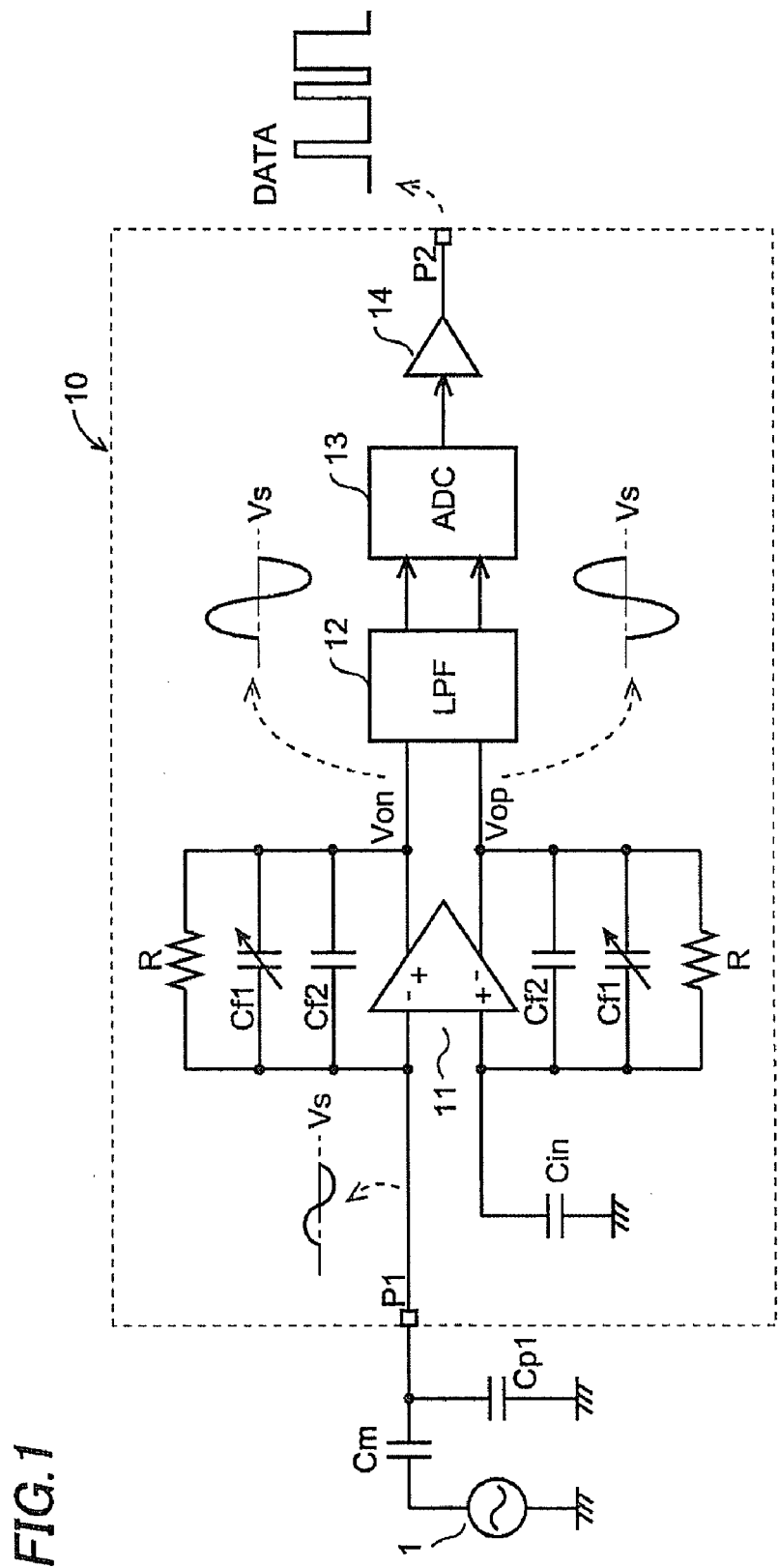
FIG. 1 is a circuit diagram of an amplifier circuit of a capacitor microphone of an embodiment of the invention.

FIG. 1 is a circuit diagram of the amplifier circuit of the capacitor microphone of the embodiment. As shown in the figure, the amplifier circuit of the capacitor microphone is made of a capacitor Cm as the capacitor microphone and an amplification portion 10 of LSI. This capacitor Cm is an electret capacitor microphone (ECM) that does not need a bias voltage, but this may be a MEMS microphone of which an end is applied with a bias voltage. An input signal source 1 is connected to one end of the capacitor Cm, and this is a sound source that is equivalently shown on an electric circuit.

By a change of the capacitance value of the capacitor Cm in response to sound, an electric signal corresponding to the sound is outputted from the other end of the capacitor Cm. Cp1 indicates a parasitic capacitor which a wiring connecting the capacitor Cm to the amplification portion 10 has.

The amplification portion 10 is configured as one LSI die, in which an inversion amplifier circuit formed using an operational amplifier 11 is provided. The capacitor Cm is connected to an inversion input terminal (−) of the operational amplifier 11 through a terminal P1 of the LSI die. In detail, an electric signal from the capacitor Cm is applied to the inversion input terminal (−) of the operational amplifier 11 as an input signal.

An input capacitor Cin is connected to a non-inversion input terminal (+) of the operational amplifier 11. The capacitance value CAin of the input capacitor Cin is preferably set equal to the sum of the capacitance value CAm of the capacitor Cm and the capacitance value CAp1 of the parasitic capacitor Cp1 in order to obtain output signals Von, Vop of the operational amplifier 11 that have symmetrical waveforms with respect to a center voltage Vs.

(CAin=CAm+CAp1)

The operational amplifier 11 has a non-inversion output terminal (+) and an inversion output terminal (−) that are configured to output signals Von, Vop as a pair of differential voltages inverted with respect to the center voltage Vs. A first feedback capacitor Cf1, a second feedback capacitor Cf2 and a feedback resistor R are connected in parallel between the non-inversion output terminal (+) and the inversion input terminal (−). Furthermore, in a symmetrical manner, a first feedback capacitor Cf1, a second feedback capacitor Cf2 and a feedback resistor R are connected in parallel between the inversion output terminal (−) and the non-inversion input terminal (+).

The inversion amplifier circuit made of the operational amplifier 11 thus has a gain that is determined by CAm/CAf. CAf is the sum of the capacitance value CAf1 of the first feedback capacitor Cf1 and the capacitance value CAf2 of the second feedback capacitor Cf2, i.e., CAf=CAf1+CAf2. In order to obtain the gain of 1 or more, CAf is set at a smaller value than CAm. CAm may be a minute value, for example, about several pF, and CAf may be set at a very minute value accordingly.

Since the inversion input terminal (−) and the non-inversion input terminal (+) float when only the capacitor Cm, the first and second feedback capacitors Cf1, Cf2 are connected to these and smoothing is hardly expected due to the minute capacitances of these, the potentials of these input terminals are unstable. Therefore, the feedback resistors R are parallelly connected to feedback routes respectively to which the capacitors Cf1, Cf2 are connected, thereby achieving the stability of the potentials of the input terminals.

The feedback resistors R are required to prevent a potential change that occurs in the inversion input terminal (−) and the non-inversion input terminal (+) in response to sound from passing through the feedback resistor R to the inversion output terminal (−) and the non-inversion output terminal (+), and to keep a high output impedance relative to the capacitor Cm. Therefore, the feedback resistors R are set high enough, and are just directly connected between the inversion input terminal (−) and the non-inversion output terminal (+) and between the non-inversion input terminal (+) and the inversion output terminal (−), respectively.

After high frequency components are removed from the output signals Von, Vop of the operational amplifier 11 through a low-pass filter 12, the output signals Von, Vop are inputted to an AD converter 13 and converted to a digital signal as an output signal. The output signal of the AD converter 13 is outputted from an output terminal P2 through an output buffer 14 (see the waveform of DATA in FIG. 1). The AD converter 13 is a sigma-delta type AD converter, for example.

The first feedback capacitor Cf1 of the operational amplifier 11 is formed using changeable capacitance type MOS capacitor elements, and has a characteristic of increasing the capacitance value CAf1 according to the amplitude of an input signal generated by the capacitor Cm increases. On the other hand, the second feedback capacitor Cf2 is a capacitor having low voltage dependency, and has a characteristic of hardly changing the capacitance value CAf2 even when the amplitude of the input signal increases.

Therefore, CAf increases according to the amplitude of the input signal increases and accordingly the gain CAm/CAf of the operational amplifier 11 decreases, thereby limiting the output signals Von and Vop of the operational amplifier 11. This limits the output signals Von, Vop of the operational amplifier 11 to the supply voltage or lower even when the amplitude of the input signal becomes too large. Furthermore, an input signal to the AD converter 13 in the subsequent stage is limited to the full scale level or lower, and the total harmonic distortion characteristic (THD characteristic) is highly improved.

The second feedback capacitor Cf2 is provided in order to control the voltage dependency (the dependency on the input signal amplitude) of the capacitance value CAf (the sum of the capacitance value CAf1 and the capacitance value CAf2). For example, the voltage dependency is decreased by increasing CAf2. In detail, when the input signal becomes high, an amount of limitation of the output signals Von, Vop of the operational amplifier 11 is controllable by controlling the gain of the operational amplifier 11. Accordingly, if such control is not necessary, the second feedback capacitor Cf2 may be omitted.

Figure 2:
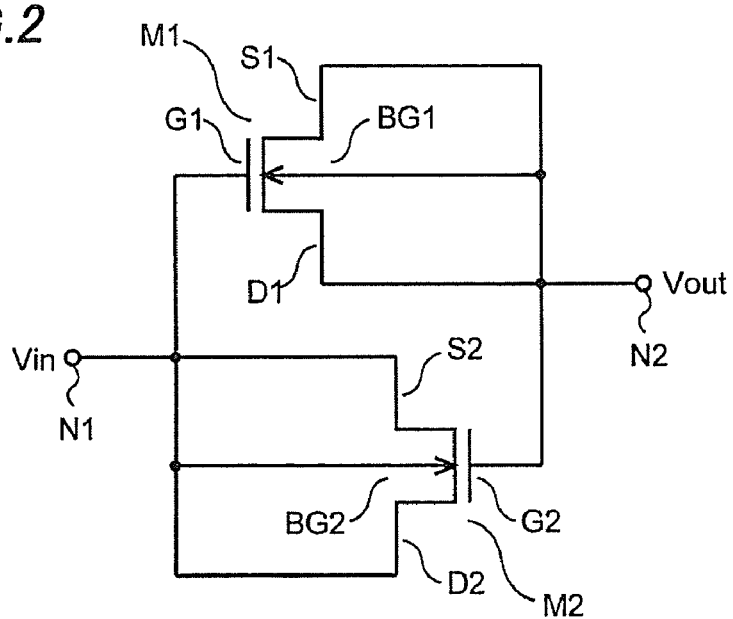
FIG. 2 is a diagram showing a structure of a first feedback capacitor.
Figure 3:
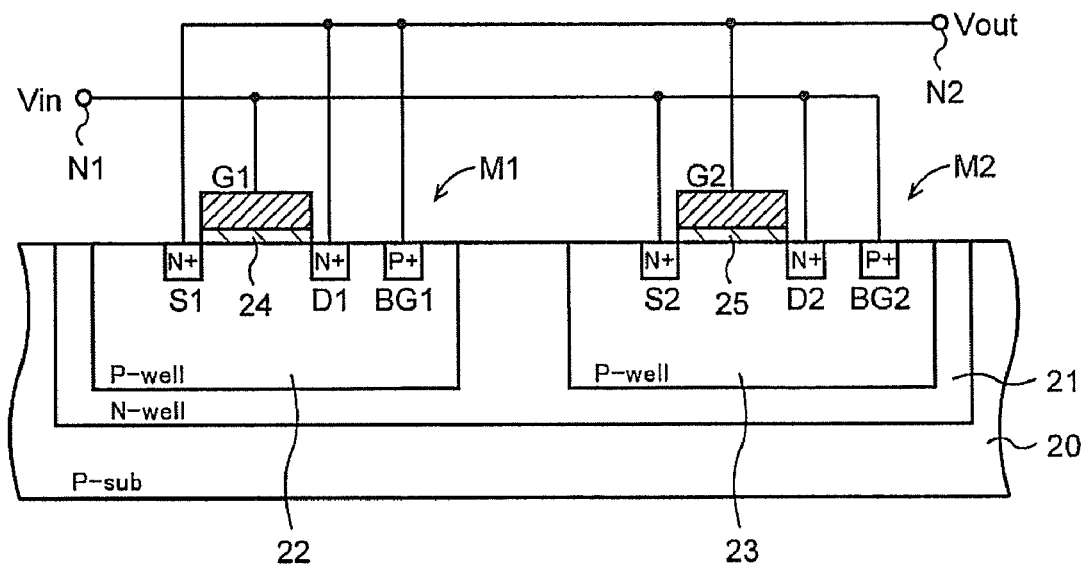
FIG. 3 is a cross-sectional view showing the structure of the first feedback capacitor.

FIG. 2 is a circuit diagram showing the structure of the first feedback capacitor Cf1, and FIG. 3 is a cross-sectional view showing the structure of the first feedback capacitor Cf1, that is a cross-sectional view along a first MOS capacitor element M1 and a second MOS capacitor element M2.

The C-V characteristic (capacitance-voltage characteristic) of a single MOS capacitor is asymmetrical with respect to the center voltage (a voltage applied to the input and output terminals of the capacitor is zero), and the total harmonic distortion characteristic (THD characteristic) is not highly improved. Therefore, by connecting two same MOS capacitor elements alternately in parallel, the C-V characteristic symmetrical with respect to the center voltage is obtained and the total harmonic distortion characteristic (THD characteristic) is highly improved.

As shown in FIG. 2, the first MOS capacitor element M1 has a first gate G1, a first back gate BG1, a first source S1 and a first drain D1. Furthermore, the second MOS capacitor element M2 has a second gate G2, a second back gate BG2, a second source S2 and a second drain D2. The first and second MOS capacitor elements M1, M2 are enhancement type N-channel MOS transistors having the same structures and sizes.

The first gate G1 and the second back gate BG2 are electrically connected. This connection node is N1. The second gate G2 and the first back gate BG1 are electrically connected. This connection node is N2. An input voltage Vin is applied to the node N1, and an output voltage Vout is applied to the node N2. The node N1 is connected to the inversion input terminal (−) of the operational amplifier 11 in FIG. 1, and the node N2 is connected to the non-inversion output terminal (+) of the operational amplifier 11.

FIG. 3 is a cross-sectional view showing the device structure of the first feedback capacitor Cf1. As shown in the figure, an N type well 21 is formed on the front surface of a P type semiconductor substrate 20. A first P type well 22 and a second P type well 23 are formed on the front surface of this N type well 21. The first MOS capacitor element M1 is formed on the first P type well 22, and the second MOS capacitor element M2 is formed on the second P type well 23.

In this case, the first P type well 22 is the first back gate BG1 of the first MOS capacitor element M1. The second P type well 23 is the second back gate BG2 of the second MOS capacitor element M2. The first gate G1 is formed on a gate insulation film 24 (a capacitor insulation film), and the second gate G2 is formed on a gate insulation film 25 (a capacitor insulation film). Preferably, the gate insulation films 24, 25 are made of the same materials and have the same thicknesses.

The device structure of the first feedback capacitor Cf1 is not limited to the structure using the P type semiconductor substrate 20 and the triple well structure as described above. It may use an N type semiconductor substrate instead of the P type semiconductor substrate 20, and the first P type well 22 and the second P type well 23 may be formed on the front surface of the substrate.

Figure 4A:
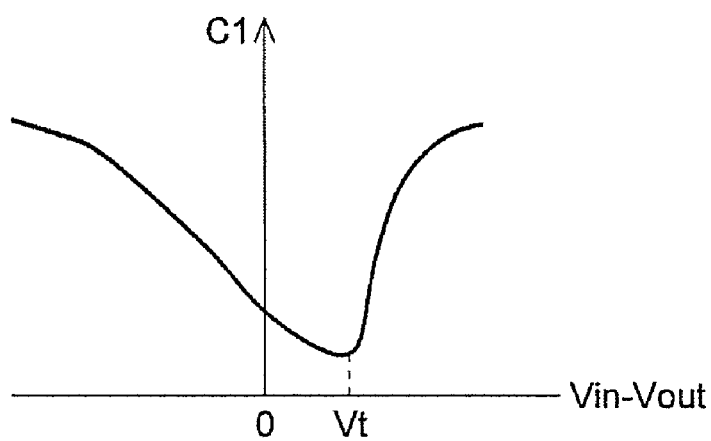
FIGS. 4A, 4B and 4C are graphs for explaining the C-V characteristic of the first feedback capacitor.
Figure 4B:
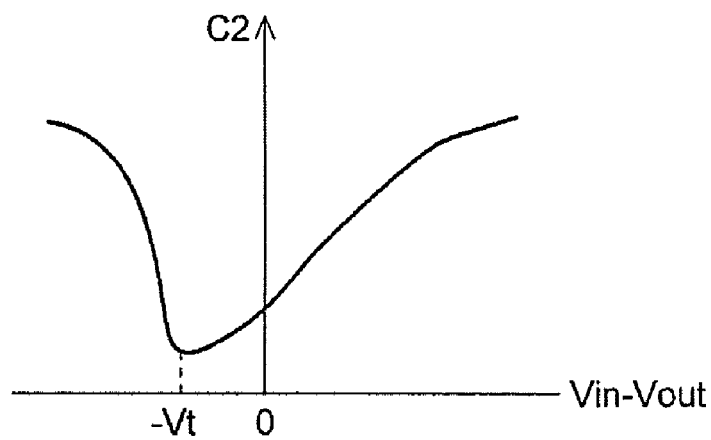
Figure 4C:
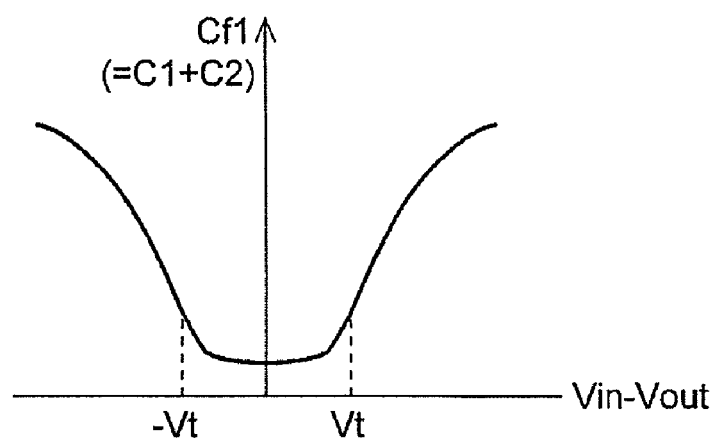

FIGS. 4A, 4B and 4C are graphs showing the C-V characteristic of the first feedback capacitor Cf1. FIG. 4A shows the C-V characteristic of the first MOS capacitor element M1. The axis of abscissas indicates a voltage (=Vin-Vout) applied to the first MOS capacitor element M1, and the axis of ordinates indicates the capacitance value C1. As shown in the figure, when the applied voltage is Vt (threshold) or more, the capacitance value C1 increases sharply since an inversion layer is formed in the channel. When the applied voltage is Vt (threshold) or lower and near Vt, the capacitance value C1 is low since a depletion layer is formed in the channel. However, as the applied voltage further shifts in the negative direction, the channel becomes in a storage state and the capacitance value C1 increases. This C-V characteristic is asymmetrical with respect to the center voltage (0V).

FIG. 4B shows the C-V characteristic of the second MOS capacitor element M2. As shown in the figure, this C-V characteristic has a reversed shape of the C-V characteristic of the first MOS capacitor element M1 with respect to the axis of ordinates in the figure. In detail, when the applied voltage becomes lower than −Vt, the capacitance value C2 increases sharply since an inversion layer is formed in the channel. When the applied voltage is −Vt (threshold) or more and near −Vt, the capacitance value C2 is low since a depletion layer is formed in the channel. However, as the applied voltage shifts in the positive direction, the channel becomes in a storage state and the capacitance value C2 increases. This is opposite to the C-V characteristic of the first MOS capacitor element M1.

FIG. 4C shows the C-V characteristic of the first feedback capacitor Cf1. This is the sum of the C-V characteristics of the first MOS capacitor element M1 and the second MOS capacitor element M2. As apparent from this, the C-V characteristic of the first feedback capacitor Cf1 is symmetrical with respect to the center voltage (0V).

At this time, when the first and second back gates BG1, BG2 are set at the ground voltage (0V), a back gate bias effect does not occur when the center voltage is the ground voltage (0V), but when the center voltage is not 0V the C-V characteristic becomes asymmetrical with respect to the center voltage by a back gate bias effect. In actual, in the case of the circuit in FIG. 1, due to the virtual short of the operational amplifier 11, the center voltage Vs applied to the first feedback capacitor Cf1 becomes half of the supply voltage Vdd of the operational amplifier 11. When the C-V characteristic becomes asymmetrical with respect to the center voltage by a back gate bias effect, the total harmonic distortion increases when the input signal becomes too high, and thus the total harmonic distortion characteristic (THD characteristic) is enhanced.

Therefore, as shown in FIGS. 2 and 3, the first back gate BG1 is connected to the first source S1 and the first drain D1 instead of to the ground. Similarly, the second back gate BG2 is connected to the second source S2 and the second drain D2 instead of to the ground. This eliminates a back gate bias effect even when the center voltage is other than 0V, providing the C-V characteristic of the first feedback capacitor Cf1 that is symmetrical with respect to the center voltage.

Figure 5:
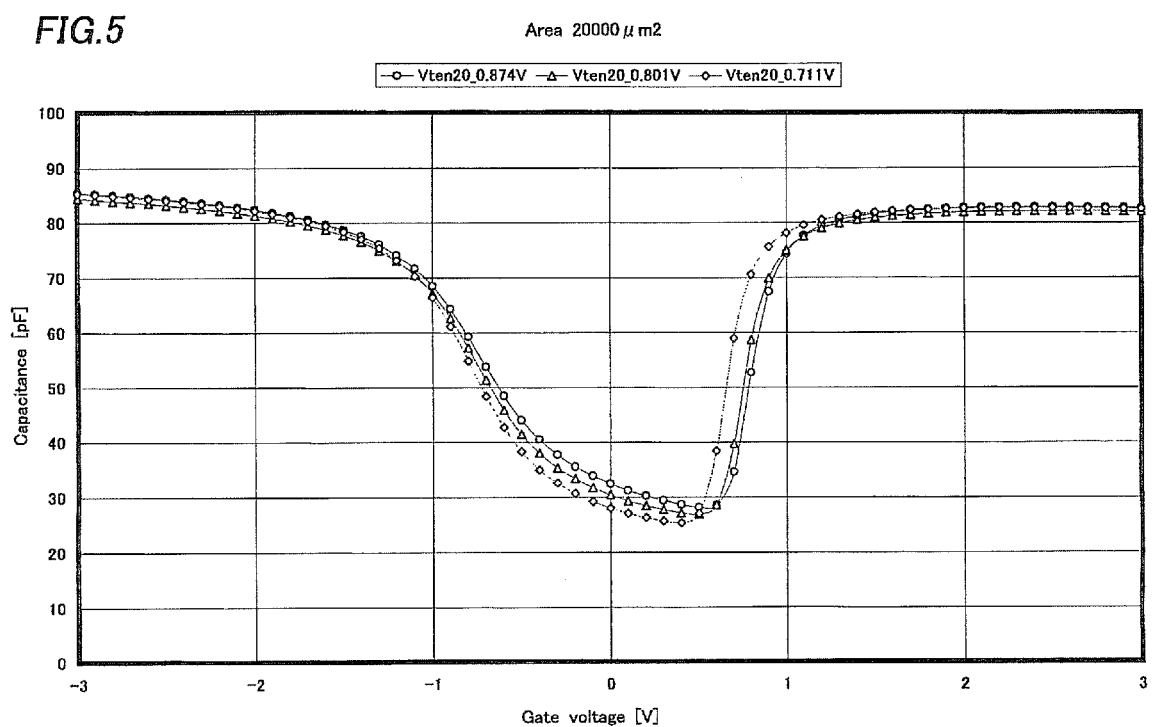
FIG. 5 is a measurement graph of the C-V characteristic of the first feedback capacitor.
Figure 6:
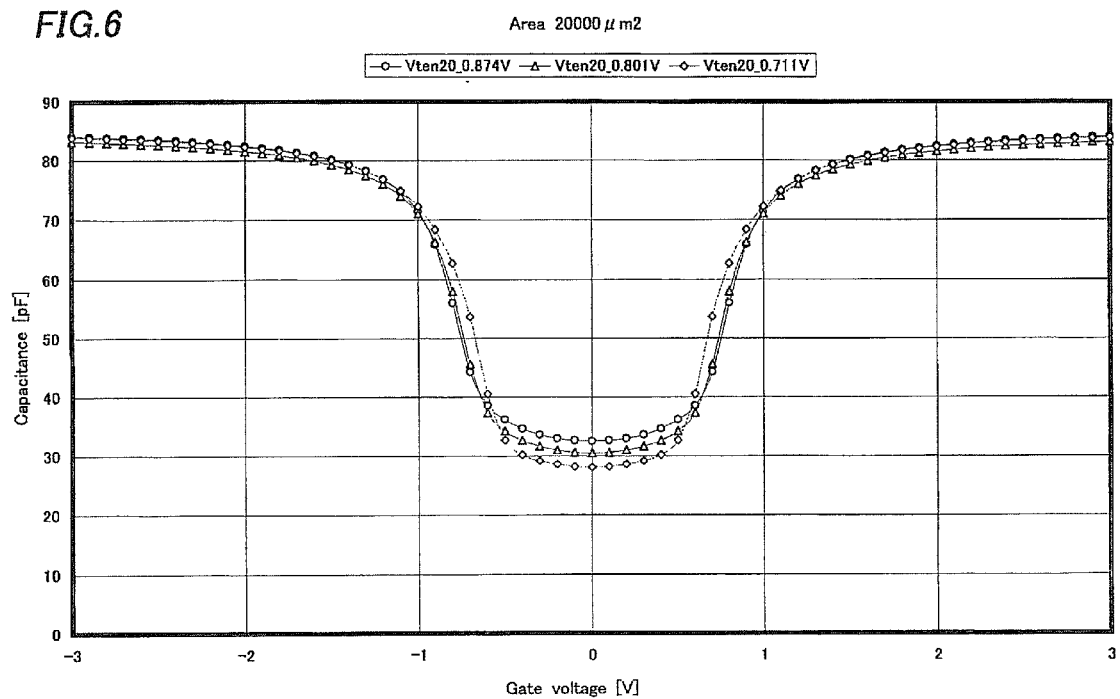
FIG. 6 is a measurement graph of the C-V characteristic of the first feedback capacitor.

FIG. 5 is a graph showing a measurement example of the C-V characteristic of the first MOS capacitor element M1 in the first feedback capacitor Cf1, and FIG. 6 is a graph showing a measurement example of the C-V characteristic of the first feedback capacitor Cf1. FIGS. 5 and 6 show a measurement example of three samples respectively, in which Vten20 indicates Vt (threshold) and area 20000 μm2 indicates the area of the first MOS capacitor element M1. It is observed that the C-V characteristic in FIG. 5 is asymmetrical with respect to the center voltage (0V), while the C-V characteristic in FIG. 6 is symmetrical with respect to the center voltage (0V).

By thus using the changeable capacitance type first MOS capacitor element M1 and second MOS capacitor element M2 as the first feedback capacitor Cf1, an output signal limiting effect is obtained in the similar manner to a general ALC circuit. Furthermore, this circuit operates at high speed compared with an ALC circuit that performs a level limiting operation after a level is detected, and the circuit size is smaller than in a case using an ALC circuit that needs a level detection circuit, a control switch, a control circuit, etc.

Furthermore, the C-V characteristics of the first and second MOS capacitor elements M1, M2 have low voltage dependency on a general input signal level, as shown in FIG. 4C. In other words, when the amplifier circuit is used under normal conditions, i.e., between the two threshold voltages, the C-V characteristic is significantly flat. Accordingly, under normal conditions, the linearity between the input signal and the output signal is maintained.

On the other hand, in a system in which a too high level of input signal is expected to be inputted to the AD converter 13 in advance, the total harmonic distortion characteristic (THD characteristic) is improved more highly by controlling the sizes of the first and second MOS capacitor elements M1, M2 (the area of the gate determined by the channel length L and channel width W of the MOS transistor) so that the maximum level of the signal inputted to the AD converter 13 becomes 0 dBFS or lower.

Furthermore, the changeable capacitance range is controllable by changing the sizes of the first and second MOS capacitor elements M1, M2. It is noted that even when the first and second MOS capacitor elements M1, M2 are of a P channel type instead of an N channel type, the C-V characteristic symmetrical with respect to the center voltage is achieved.

Figure 7:
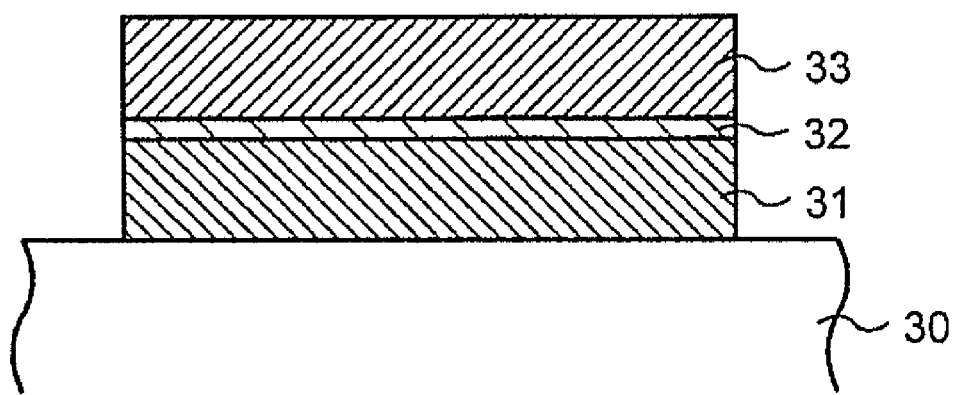
FIG. 7 is a cross-sectional view showing a structure of a second feedback capacitor.

FIG. 7 is a cross-sectional view showing the structure of the second feedback capacitor Cf2. The second feedback capacitor Cf2 is formed on the same P type semiconductor substrate 20 on which the first feedback capacitor Cf1 is formed. A first polycrystalline semiconductor layer 31 (e.g. a polysilicon layer), a capacitor insulation layer 32 (e.g. a silicon oxide layer), a second polycrystalline semiconductor layer 33 (e.g. a polysilicon layer) are layered and formed on the P type semiconductor substrate 20 with an interlayer insulation film 30 being interposed therebetween. In detail, the capacitor insulation layer 32 is disposed between the first and second polycrystalline semiconductor layers 31, 33. A high concentration of N-type impurities or P-type impurities is doped in the first and second polycrystalline semiconductor layers 31, 33 and thus the voltage dependency of the C-V characteristic is low. This impurity concentration is higher than the impurity concentration of the first and second P type wells 21, 22.

The second feedback capacitor Cf2 is not limited to the PIP (a polysilicon layer—an insulation layer—a polysilicon layer) capacitor structure as described above, and may be of an N type depletion MOS capacitor of which the C-V characteristic has low voltage dependency.

In the amplifier circuit of the capacitor microphone of the invention, the gain is limited by the C-V characteristic (capacitance-voltage characteristic) of the feedback capacitor according to the input signal from the capacitor microphone increases, and thus the levels of the output signals of the amplifier circuit are limited to the full scale level of the circuit in the subsequent stage or lower or limited to the supply voltage of the inversion amplifier or lower. In particular, when the circuit in the subsequent stage is an AD converter, the total harmonic distortion characteristic (THD characteristic) is highly improved.

Furthermore, the invention limits the gain of the amplifier circuit by using the C-V characteristic of the feedback capacitor, thereby providing high speed operation and small circuit size compared with a case using a general ALC circuit (an automatic level control circuit) for level limitation.

What is claimed is:

1. An amplifier circuit of a capacitor microphone, comprising:
    a capacitor microphone generating an input signal corresponding to a sound received by the capacitor microphone;
    an operational amplifier comprising an input terminal and an output terminal, the input signal from the capacitor microphone being applied to the input terminal;
    a first feedback capacitor connected between the output terminal and the input terminal of the operational amplifier and configured to increase a capacitance in response to an increase in an amplitude of the input signal; and
    a feedback resistor connected between the output terminal and the input terminal of the operational amplifier,
    wherein the first feedback capacitor comprises a first MOS transistor comprising a first gate, a first back gate, a first source and a first drain and a second MOS transistor comprising a second gate, a second back gate, a second source and a second drain, the first gate is connected to the second back gate, and the second gate is connected to the first back gate.

2. The amplifier circuit of claim 1, wherein the first back gate is connected to the first source and the first drain, and the second back gate is connected to the second source and the second drain.

3. The amplifier circuit of claim 1, further comprising an AD converter converting an output signal of the operational amplifier to a digital signal.

4. An amplifier circuit of a capacitor microphone, comprising:
    a capacitor microphone generating an input signal corresponding to a sound received by the capacitor microphone;
    an operational amplifier comprising an input terminal and an output terminal, the input signal from the capacitor microphone being applied to the input terminal;
    a first feedback capacitor connected between the output terminal and the input terminal of the operational amplifier and configured to increase a capacitance in response to an increase in an amplitude of the input signal;
    a feedback resistor connected between the output terminal and the input terminal of the operational amplifier; and
    a second feedback capacitor connected between the output terminal and the input terminal of the operational amplifier, a capacitance of the second feedback capacitor being less dependent on the input signal than the capacitance of the first feedback capacitor.

5. The amplifier circuit of claim 4, wherein
    the first feedback capacitor comprises a first MOS transistor comprising a first gate, a first back gate, a first source and a first drain and a second MOS transistor comprising a second gate, a second back gate, a second source and a second drain, the first gate is connected to the second back gate, and the second gate is connected to the first back gate,
    the second feedback capacitor comprises first and second polycrystalline semiconductor layers and a capacitor insulation layer disposed between the first polycrystalline semiconductor layer and the second polycrystalline semiconductor layer, and
    impurity concentrations of the first and second polycrystalline semiconductor layers are higher than impurity concentrations of the first and second back gates.

6. The amplifier circuit of a capacitor microphone, comprising:
    a capacitor microphone generating an input signal corresponding to a sound received by the capacitor microphone;
    an operational amplifier comprising an input terminal and an output terminal, the input signal from the capacitor microphone being applied to the input terminal;
    a first feedback capacitor connected between the output terminal and the input terminal of the operational amplifier and configured to increase a capacitance in response to an increase in an amplitude of the input signal; and
    a feedback resistor connected between the output terminal and the input terminal of the operational amplifier,
    wherein a C-V characteristic curve of the first feedback capacitor is symmetric with respect to a center voltage of the characteristic curve.

* * * * *